United States Patent [19]

Schwalenstocker

[11] 3,895,377

[45] July 15, 1975

[54] VOLTAGE-TO-PULSE CONVERSION APPARATUS AND METHOD

[75] Inventor: Thomas H. Schwalenstocker, Glenshaw, Pa.

[73] Assignee: Westinghouse Electric Corporation, Pittsburgh, Pa.

[22] Filed: July 5, 1972

[21] Appl. No.: 268,949

[52] U.S. Cl. ......... 340/347 AD; 176/22; 235/92 CC; 235/151.34; 340/347 NT

[51] Int. Cl. ........................ H03k 13/20; G21c 17/02

[58] Field of Search ............... 340/347 NT, 347 AD; 235/183, 150.51, 151.34; 176/19 R, 22

[56] References Cited

UNITED STATES PATENTS

| | | | |
|---|---|---|---|
| 3,313,924 | 4/1967 | Schulz et al. | 235/183 |
| 3,327,229 | 6/1967 | Huelsman | 340/347 AD |
| 3,358,200 | 12/1967 | Clifford | 235/183 |
| 3,375,351 | 3/1968 | Deavenport | 340/347 AD |
| 3,505,673 | 4/1970 | James | 340/347 |
| 3,531,633 | 9/1970 | Johnson | 235/183 |
| 3,544,895 | 12/1970 | Richman | 340/347 AD |
| 3,550,018 | 12/1970 | James et al. | 235/150.51 |
| 3,566,685 | 3/1971 | Zimmerman et al. | 235/151.34 |
| 3,699,320 | 10/1972 | Zimmerman et al. | 235/151.34 |
| 3,706,092 | 12/1972 | Cox, Jr. | 340/347 AD |
| 3,731,072 | 5/1973 | Johnston | 340/347 |

*Primary Examiner*—Felix D. Gruber
*Attorney, Agent, or Firm*—E. F. Possessky

[57] ABSTRACT

Apparatus and a method for converting a voltage signal to a pulse signal. A digital voltage-to-pulse converter is stabilized by a feedback signal derived by a pulse-to-analog converter connected to the output. Pulses generated by a clock driven by the error signal are accumulated in a reversible digital counter. A digital-to-pulse converter generates output pulses at a rate proportional to the accumulated count. A frequency divider and one-shot multivibrator provide output pulses suitable for driving mechanical counters. The stabilization of the conversion through feedback and the extended range available through frequency division render the technique particularly suitable for integration of intermittent signals over prolonged intervals.

20 Claims, 7 Drawing Figures

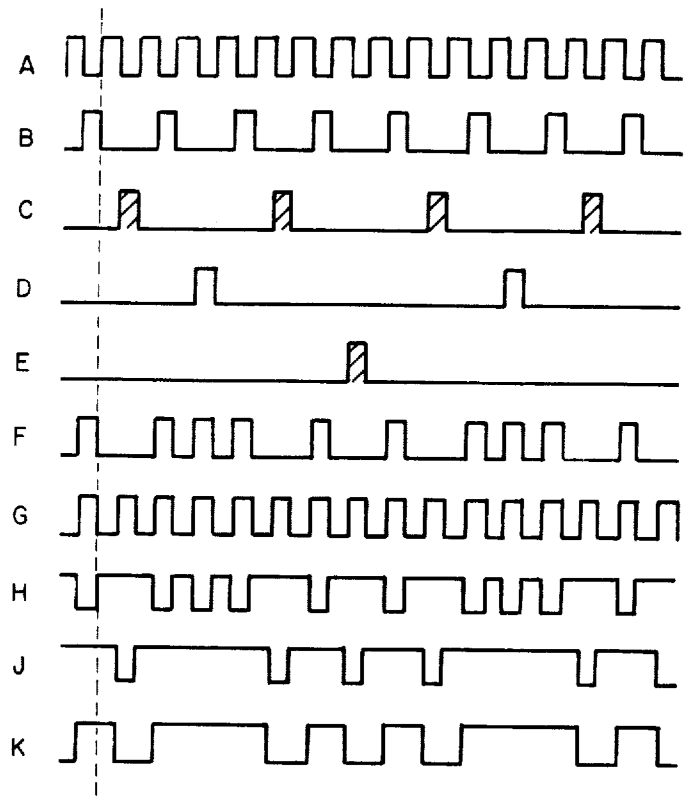
FIG.4
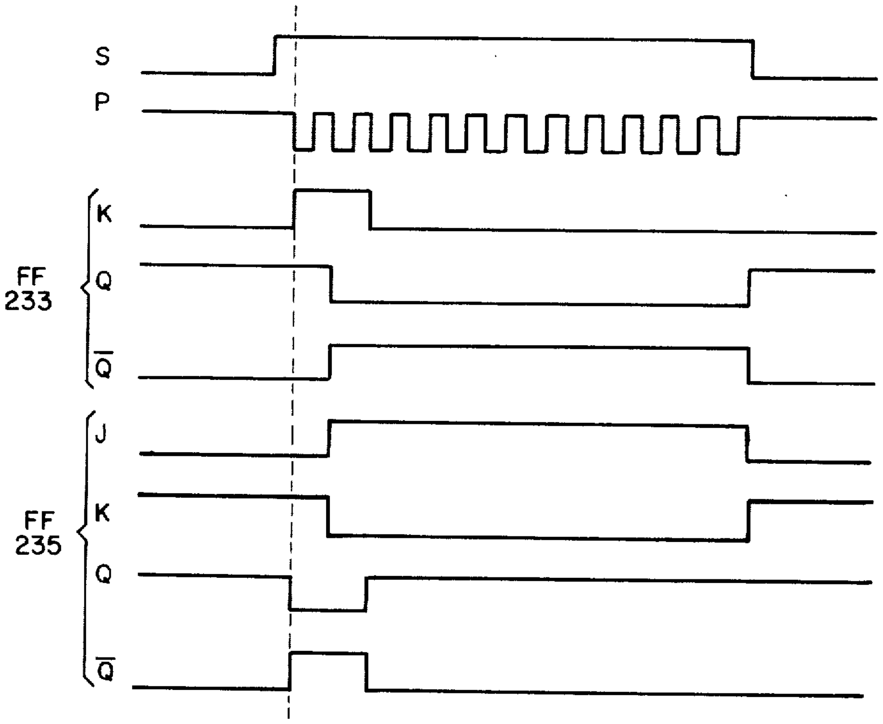
FIG.5
| Tn J | Tn K | Tn+1 Q |
|---|---|---|
| 0 | 0 | Q |
| 0 | 1 | 0 |
| 1 | 0 | 1 |
| 1 | 1 | $\overline{Q}$ |
FIG.6

VOLTAGE-TO-PULSE CONVERSION APPARATUS AND METHOD

CROSS-REFERENCE TO RELATED APPLICATIONS

1. The commonly owned application entitled "Digital-to-Analog Conversion Apparatus and Method", Ser. No. 200,367, filed in the name of James Franklin Sutherland on Nov. 19, 1971 now Pat. No. 3,754,233.

2. The concurrently filed application Ser. No. 269,000 of James Carlton entitled "Compensation Apparatus and Method" assigned to the same assignee as this application.

3. The concurrently filed application Ser. No. 268,951 of James Carlton entitled "Digital Integration Apparatus and Method" assigned to the same assignee as this application.

BACKGROUND OF THE INVENTION

1. Field of the Invention

This invention relates to an apparatus and techniques for converting voltage signals to pulse signals and particularly to such apparatus and techniques providing an extended range of conversion factors.

2. Prior Art

Voltage-to-pulse converters generate pulses at a rate which is a function of the magnitude of an applied voltage signal. They may be used to integrate the applied voltage by applying the output pulses to a digital counter. In some such applications it may be desired to integrate the applied signal over extended periods of time, such as minutes, hours, or even days.

One such application is the monitoring of the boric acid concentration and the primary loop of a pressurized water nuclear reactor electric power generating system. The boric acid serves as a moderator in the reactor and is used in large quantities should the reactor approach unacceptable limits. Since the primary loop is a closed loop system, the boric acid concentration is a function of the amount added. By integrating the amount added over a period of time the existing concentration may be monitored.

In one prior art system, a transducer generates a voltage proportional to the flow of boric acid added to the primary loop. This voltage is converted to a pulse signal by a voltage-to-pulse converter and then applied to a counter. Mechanical counters are utilized in order to preserve the accumulated count should the power be interrupted momentarily. However, mechanical counters require a relatively long pulse for satisfactory operation. This, plus the fact that the flow is being monitored over an extended period of time which could require a large count, implies that the pulse rate should be relatively slow. Another factor to be considered is that most of the time there is no flow of boric acid. It is only at infrequent intervals, therefore, that there is an input to the voltage to pulse converter. This, plus the relatively low scaling factor referred to above, can lead to large errors if the voltage-to-pulse converter drifts and ramdomly generates an inadvertent pulse. Even if these pulses are several minutes apart, the accumulated error can be significant.

The prior art voltage-to-frequency converters, employed analog integrators to generate ramp functions which triggered a pulse generator when the output of the integrator reach some preset level. These prior art integrators comprise capacitors in the feedback loop of an operational amplifier which arrangement is subject to drift over extended time intervals. Threshold devices have been incorporated into these prior art converters to block the output pulses when the input is below a predetermined level. However, if the threshold is set high enough to eliminate inadvertent excursions above that level, the stored charge on the capacitor can cause inaccuracies in the measurement.

SUMMARY OF THE INVENTION

According to the invention, a stabilized voltage-to-pulse converter incorporates an error signal generator which sums a feedback signal in opposition to the applied signal. Pulses generated by a clock driven by the error signal are counted up or down, depending upon the polarity of the error signal, in a reversible digital counter. The accumulated count is converted to a pulse train by a digital-to-pulse converter. This pulse train which serves as the output of the voltage-to-pulse converter is also converted to an analog signal and applied to the error signal generator as the feedback signal. The accumulated count, therefore, increases until it reaches a count proportional to the level of the input signal at which time the error signal becomes zero. With the accumulated count remaining constant, the output pulses are generated by the digital-to-pulse converter at a fixed rate. When the input signal is removed, the error signal will reverse polarity and drive the feedback signal back down to zero. The feedback signal locks the voltage-to-pulse converter at zero input and no output pulses are generated.

In accordance with the invention, the accuracy of the clock is not critical, since the feedback assures that the counter is driven to the correct count. In fact, a fixed frequency clock could be used; however, a voltage-to-frequency converter is preferred.

Also according to the invention, the pulses generated by the stabilized high-frequency voltage-to-pulse converter are divided down by a frequency divider and then applied to a one-shot multivibrator which generates output pulses of appropriate rate and duration to drive a mechanical counter. The frequency divider includes a binary digital counter which counts the pulses developed by the digital-to-pulse generator and means for tapping selected bits of the counter. The selected bit will oscillate between a zero and one output at the rate of the pulses generated by the digital-to-pulse generator divided by 2 raised to the power of the bit. Thus, each successive bit divides the count by 2. The selected bit triggers the one-shot multivibrator which generates shaped pulses at the selected rate. continuous selection of output pulse rates can be provided by providing for a continuous selection between one and two for the gain in the feedback circuit of the voltage-to-pulse converter.

The invention includes the method of converting a voltage signal to a pulse signal by summing the applied signal in opposition to a feedback signal to generate an error signal, converting the error signal to a pulse signal, accumulating a count of the pulses, converting the accumulated count to an output pulse signal and generating the analog feedback signal from the output pulse signal. The invention further contemplates dividing down the output pulses over an extended range.

The invention is particularly suitable for the integration of intermittent signals over extended time intervals. Such an application includes the monitoring of the boric acid concentration in the primary loop of a pressurized water nuclear reactor. The intermittent addition of boric acid generates the voltage signal applied to the voltage-to-pulse converter. The generated pulses are applied to a mechanical counter which integrates the boric acid added.

BRIEF DESCRIPTION OF THE DRAWINGS

An understanding of the invention can be gained from a reading of the following description, taken in conjunction with the accompanying drawings, in which:

FIG. 4 is a composite wave form of selected signals generated in a digital-to-pulse converter;

FIG. 5 is a composite wave form diagram of selected signals generated in the one-shot multivibrator; and FIG. 6 is a truth table for a JK flip-flop.

DESCRIPTION OF THE PREFERRED EMBODIMENT

Figure 1:
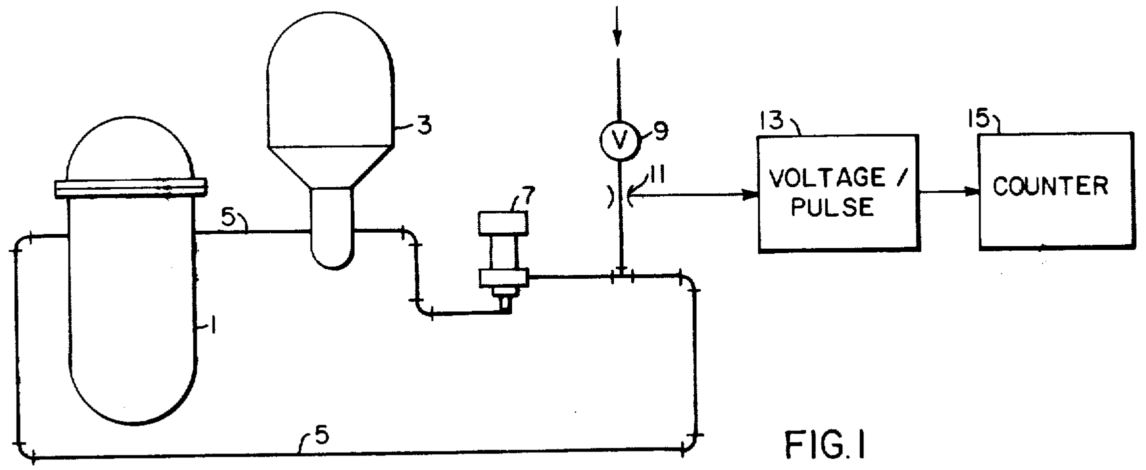
FIG. 1 is a simplified schematic diagram of a pressurized water reactor boric acid concentration monitoring system embodying the invention.

Although the invention has many other applications, it will be described as applied to the boric acid concentration monitoring system for the pressurized water nuclear reactor illustrated in FIG. 1. Pressurized water is circulated through a primary loop which includes the nuclear reactor 1, steam generator 3, and interconnecting piping 5 by pump 7. The thermal energy generated by the nuclear reaction is transferred by the pressurized water to the steam generator where it may be used to generate the steam to drive an electric power generating system (not shown). Boric acid which is added to the pressurized water serves as a moderator in the reactor. Should the operating level of the reactor approach predetermined limits, large amounts of boric acid may be added to the primary loop water to maintain the system within the preset operating conditions. In normal circumstances, small amounts of boric acid may be added to the pressurized water at widely spaced intervals to maintain the predetermined concentration. Boric acid is added to the primary loop through valve 9.

A flow meter 11 generates a voltage signal with an amplitude proportional to the rate of flow of the boric acid. This voltage signal is converted to a pulse signal by the voltage-to-pulse converter 13. These pulses which are generated at a rate proportional to the flow of boric acid are counted in the counter 15. Preferably the counter is a mechanical counter which will retain the accumulated count despite an interruption in power. Since the primary loop is a closed system, the accumulated count in the counter 15 is representative of the concentration of boric acid in the primary loop. Under normal operating conditions. boric acid will be added in very small amounts and at very infrequent intervals. In addition, since the pulse rate must be slow enough for the mechanical counter to count the pulses while boric acid is being added, the pulses delivered to the counter by the voltage-to-pulse converter 13 over an extended period will be relatively few. It is important, therefore, that the voltage-to-pulse converter 13 be stable and not generate random output pulses.

Figure 2:
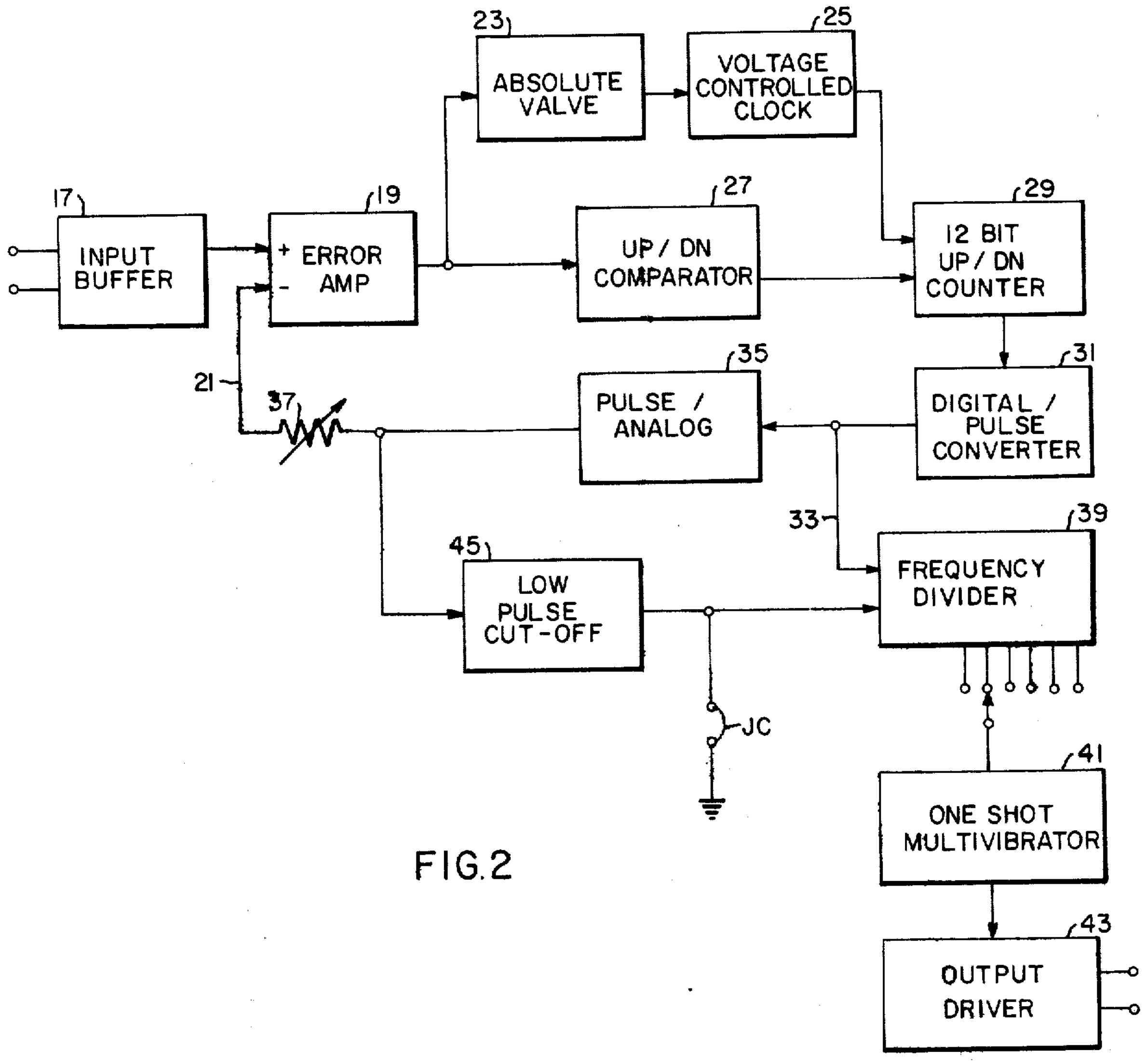
FIG. 2 is a block diagram of a voltage-to-pulse converter according to the invention.

Referring to FIG. 2 for a block diagram of the voltage-to-pulse converter according to the invention, an input buffer 17 is used to regulate the span of the input signal and, if needed, to convert a differential signal to a single ended signal. This processed input signal is then applied to one input of the error amplifier 19 where it is summed in opposition to a feedback signal applied through lead 21 to generate an error signal. The bipolar error signal is converted to a unipolar signal by the absolute value circuit 23 which drives the voltage controlled clock 25. A fixed frequency clock could be used but it is preferable that the clock generate pulses at a rate proportional to the magnitude of the applied signal. The error signal is also applied to the up/down comparator 27 which generates either a count-up or count-down signal depending upon the polarity of the error signal.

The pulses generated by the voltage controlled clock 25 are counted in a 12-bit reversible binary counter 29 in the direction commanded by the up/down comparator 27. The accumulated count in the 12-bit counter 29 is converted to a pulse train by the digital-to-pulse converter 31. This pulse train, which appears on lead 33, is the output of the voltage-to-pulse converter. This pulse train is also applied to the pulse-to-analog converter 35 which generates the feedback signal which is applied through lead 21 to the error amplifier 19. This feedback signal is applied to the error amplifier through a potentiometer 37 which is utilized to provide continuous scaling of the output signal as will be discussed hereafter.

If a large positive step signal is applied to the input of the voltage-to-pulse converter, a large initial error signal will be generated. This large error signal will cause the voltage control clock to generate pulses at a rapid rate and the count in the counter 29 will build up rapidly. As the count accumulates on the counter the rate of the pulses appearing on lead 33 will increase rapidly. The feedback signal generated by the pulse-to-analog converter 35 will, therefor, also increase rapidly thereby reducing the error signal. When the accumulated count in the 12-bit counter 29 reaches a count proportional to the amplitude of the input signal, the feedback signal will equal the applied signal and no more pulses will be generated by the voltage-controlled clock. With the count in the 12-bit counter steady, the output pulses on lead 33 will be generated at a constant rate. When the input signal is removed a large negative error signal will be generated by the error amplifier 19 to initiate rapid countdown of the 12-bit counter 29. This will reduce the rate of output pulses generated and also decrease the magnitude of the feedback signal. When the counter has counted down to zero, the feedback signal will be equal to zero and no error signal will be generated.

The pulses generated on lead 33 are in the kilocycle range. This pulse rate may be reduced by steps of 2 by the frequency divider 39. In the exemplary embodiment of the invention sufficient stages of the frequency divider are provided so that the pulse rate may be divided by as much as 4 million. Since the duration of the pulses appearing at the output of the frequency divider will vary as a function of the rate selected, a one-shot multivibrator 41 generates shaped pulses of preset width suitable for driving a mechanical counter through the output driver 43. Although not required at zero input because of the stability of the voltage-to-pulse converter, a low-volt cut-off circuit 45 may be provided to disable the output below an adjustable input level. This circuit may be adjusted to prevent output pulses due to a zero offset of the flowmeter transducer. When the feedback signal is below a predetermined thresholds, the low-pulse cut-off circuit prevents the frequency divider from outputting pulses. This feature may be cut out by jumper JC which shorts the low-pulse cut-off signal to ground.

Referring to FIG. 3, the differential input signal is applied to the inputs of operational amplifier 47 in the input buffer 17 through resistors 49 and 51. The output of the amplifier 47 is connected through potentiometers 53 and Zener diode 55 to ground. The output signal which appears on the slider of the potentiometer is fed back through resistor 57 to the inverting input of the amplifier 47. The diodes 59 and 61 protect the amplifier 47 from overvoltage. The input buffer converts the differential signal applied to the inputs to a single-ended signal and inverts it. The Zener diode 55 limits the output signal to 10.5 volts.

The output signal from the buffer stage is applied to the summing junction 63 of the operational amplifier 65 of the error amplifier 19 through potentiometer 67 and resistor 69. The feedback signal on line 21 is also applied to the summing junction 63 through resistor 71. The other input to amplifier 65 is connected to ground through resistor 73. A feedback resistor 75 is connected between the output of amplifier 65 and the summing junction 63. Since, as noted above, the output of the buffer stage is inverted, this signal and the feedback signal will be summed in opposition by the amplifier 65. The inversion caused by the amplifier 65 will produce an error signal of the proper polarity on lead 77.

The error signal is applied to the summing junction 79 of the operational amplifier 81 of the up/down comparator 27 through input resistor 83. The other input to the amplifier is connected through resistor 85 to ground. A feedback resistor 87 is connected between the summing junction 79 and the tap point of a voltage divider formed by resistors 89 and 91 connected between the output of the amplifier and ground. It is well known that such a configuration produces high gain and it can be seen, then, that whenever the input signal to the up/down comparator goes either slightly positive or slightly negative, a saturating voltage of the opposite sense appears at the output of the amplifier 81. The capacitor 93 prevents oscillation of the circuit due to noise when a zero signal is applied.

This saturating signal is applied to the negative input of a line receiver 95 and the positive input of a line receiver 97. A suitable line receiver is Type 9622 manufactured by Fairchild Semiconductor, Inc. of Mountain View, Calif. These devices have a threshold of 1.5 volts. A positive voltage of more than 1.5 volts applied to the positive input or a negative voltage greater than 1.5 volts applied to the negative input will cause the output to go to ZERO. Otherwise the output will be a digital ONE. Thus, it can be seen that, even for a small positive error signal appearing on lead 77, the large negative signal appearing at the output of the amplifier 81 will cause the output of line receiver 95 to go to ZERO, and the output of line receiver 97 to go to ONE. Since the output of line receiver 95 goes to ZERO for a positive input signal, it is referred to as a not-up signal and it is identified by the reference character $\overline{UP}$. Similarly the output of line receiver 97 is referred to as the not-down signal, $\overline{DN}$.

The error signal appearing on lead 77 is also applied to the absolute value circuit 23. It is applied to the summing junction 103 of a first operational amplifier 105 through resistor 107 and to the summing junction 109 the second operational amplifier 111 through resistor 113. The other inputs to amplifier 105 and 111 are connected to ground through resistors 115 and 117, respectively. A feedback resistor 119 is connected between the output of the amplifier 105 and the summing junction 103. A diode 121 with its cathode connected to the output of amplifier 105 is connected in series with the resistor 119. A second feedback loop for the amplifier 105 includes a diode 123 with its anode connected to the amplifier output. A resistor 125 connects the junction between the feedback resistor 119 and diode 121 to the summing junction 109 of the second amplifier. The feedback loop of the second amplifier includes the resistor 127. The resistor 127 has a value 10 times that of resistors 107, 113 and 119 and 20 times the value of resistor 125. Therefore, the gain of amplifier 105 is one and the gain of amplifier 111 is 10 with respect to the input signal applied to resistor 113 and 20 with respect to the output of amplifier 105 which is applied to the amplifier 111 through the resistor 125.

The operation of the absolute value circuit is as follows. With a positive input signal, a negative signal of equal amplitude will appear at the output of amplifier 105 due to the inverting effect of the amplifier operated in the described mode. This negative signal, when applied to the input of amplifier 111, would, by itself, produce a positive output signal on amplifier 111 with an amplitude equal to twenty times that of the input signal due to the ratio of the resistor 127 to resistor 125. However, the positive input signal is also applied to the amplifier 111 through resistor 113. This signal by itself would produce a negative signal at the output of amplifier 111 having an amplitude equal to ten times the amplitude of the input signal. The resulting signal, therefore, is a positive signal having an amplitude equal to ten times the amplitude of the input signal.

If a negative input signal is applied to the circuit, the output of amplifier 105 will attempt to go positive. However, the diode 123 will prevent the output of amplifier 105 from rising above the forward drop voltage of this diode. The diode 121 allows amplifier 105 to sink current from summing junction 109, but does not allow it to source current. The effective output of amplifier 105 applied to amplifier 111 is zero volts from summing junction 103 through resistors 119 and 125. However, the negative input signal is applied to the amplifier 111 through resistor 113 and produces a positive output signal equal to ten times the amplitude of the input signal. It can be seen, therefore, that a positive signal having an amplitude ten times the amplitude of the input signal appears at the output of amplifier 111 regardless of the polarity of the error signal on lead 77.

The output of the absolute value circuit is applied to the summing junction 129 of an operational amplifier 131 in the voltage controlled clock 25, through input resistor 133. A capacitor 135 is inserted in the feedback circuit of amplifier 131. The terminal of the capacitor 135 which is connected to the summing junction 129 is also connected to ground through the diode 137. The output of the amplifier 131 is connected to the positive input of a line receiver 139. The output of the line receiver is connected to its own negative input, and through diode 143 to the non-inverting input of amplifier 131. This amplifier input is also connected through resistor 145 to ground. A resistor 147 is connected across the inputs of line receiver 139.

The operation of the voltage to frequency circuit can be understood by considering the point in time when the capacitor 135 is charged positively. The positive charge on capacitor 135 forces the output of the line receiver 135 to ZERO. The positive signal applied to the summing junction 129 of amplifier 131 by the absolute value circuit will tend to drive the output of the amplifier 131 negative, thus discharging the capacitor 135. The rate of the discharge is determined by the magnitude of the applied signal. When the potential on the output of amplifier 131 decays to +1.5 volts, a digital ONE signal will appear at the output of line receiver 139. This digital ONE signal is a +5 volts which is applied to the negative input of line receiver 139 to maintain it in the ONE state. The +5 volts from the line receiver is also applied to the non-inverting input of amplifier 141 which causes rapid charging of the capacitor 135 through diode 137. When the output of amplifier 135 reaches 6.5 volts so that the positive input to line receiver 139 becomes 1.5 volts more positive than the negative input, the output of the line receiver will switch to ZERO. Thus, the circuit has returned to the initial state. The charging time of the capacitor 135 is fixed and controls the width of the pulses generated at the output of line receiver 139. The interval between pulses is determined by the magnitude of the signal applied through resistor 133. Since the pulse width is small compared to the interval between pulses, the rate at which pulses are generated is a function of the amplitude of the error signal appearing on lesd 77.

The clock pulses appearing at the output of line receiver 139 are applied to the clock input of the 12-bit up/down counter 29. This up/down counter includes a 12-bit reversible binary counter 30. Such counters are widely available in integrated circuit form and with varying numbers of digits. The clock pulses are gated by NAND elements 149 and 151. A NAND element is a well known logic circuit which produces a ZERO output signal if all of its inputs are digital ONES, otherwise, its output is ONE. Additional inputs to the NAND 149 include the output of NAND element 153, the output of down limit flip-flop 155, and the $\overline{UP}$ signal. Additional inputs to NAND 151 include the output of NAND 153, the output of up limit gate 157 and the $\overline{DN}$ signal. The inputs to the NAND element 153 are the $\overline{UP}$ and $\overline{DN}$ signals so that the output of this element will always be a ONE unless neither an up or a down signal is being generated. The output of NAND element 149 will go to ZERO only if all of the inputs are equal to ONE at the same time. This will occur on clock pulses if the $\overline{UP}$ signal is equal to ONE indicating a negative error signal, the $\overline{DN}$ signal is equal to ZERO and the output of the down limit flip-flop 155 is equal to ONE indicating that the counter has not reached the down limit. The high to low transition on the output of the NAND 149 will cause the binary counter 30 to count down. The counter will continue to count down for each clock pulse as long as the $\overline{UP}$ signal remains equal to ONE. Similarly, the output of NAND 151 will go to ZERO to cause the counter to count in the up direction for each clock pulse if the $\overline{DN}$ signal is equal to ONE and the counter has not reached its upper limit as indicated by a ONE at the output of the up limit flip-flop 157.

The purpose of the up and down limit flip-flops 157 and 155, respectively, is to prevent the counter from rolling over should the counter reach either limit. These flip-flops are controlled by signals on the carry-up and carry-down buses of the counter. These carry-up and carry-down signals are normally equal to ONE and go to ZERO when the associated limit is reached. If the counter is counting in the down direction so that the $\overline{UP}$ signal is equal to ONE, the output of the down limit flip-flop 155 will go to ZERO when the carry-down signal applied to this flip-flop goes to ZERO. The ZERO output of flip-flop 155 will force all the bits in the counter to ZERO through lead 159 and will block the further gating of clock pulses to the count-down input of the counter by disabling the gate 149. When the $\overline{UP}$ signal goes to ZERO indicating that the counter is ready to count in the up direction, the output of the flip-flop 155 will go to ONE to release the counter.

Similarly, the output of the up limit flip-flop 157 will go to ZERO to disable the count-up gate 151 and set all ones in the counter through lead 161 if the $\overline{DN}$ signal is equal to ONE and the counter reaches the upper limit as indicated by a ZERO on the lead 163. Thus, the counter will count the clock pulses in the up or down direction as determined by the direction signals but will lock up in the upper or lower limits to prevent rollover.

The binary number accumulated in number 12-bit counter 30 is converted to a pulse train by the digital-to-pulse converter 31. The converter shown utilizes a rate multiplier 167 driven by a crystal controlled clock 169. A suitable rate multiplier may comprise Type SN-7497 Synchronous Rate Multiplier manufactured by Texas Instruments, Inc. of Dallas, Tex. Reference (1) above may be referred to for a description of the basic operation of a rate multiplier. Essentially, the Texas Instrument rate multiplier utilized includes a free-running binary counter, which will be referred to as the rate counter, and a series of AND gates. Actually, two six-bit rate counters are cascaded to provide a 12-bit rate counter. The bits of the rate counter are individually gated in reverse order with the bits in the counter 30, the clock pulses, and the complements of all lower order bits of the rate counter. In other words, the least significant bit of the rate multiplier counter is gated with the most significant bit of the counter 30, and pulses from the crystal-controlled clock. The most significant bit of the rate counter is gated with the least significant bit of the counter 30, the clock pulses and the compliments of all other bits of the rate counter.

As the rate counter counts from zero to the maximum count, the ONE bits act as enabling signals for the associated AND gates and as disabling signals for all higher order AND gates. Thus, only when all of the lesser significant bits in the rate counter are equal to ZERO can an output pulse be generated by a ONE in the counter 30 and a corresponding ONE in the rate counter. It can be appreciated, then, that if the most significant bit of the counter 30 is equal to one, these conditions will be met on every other clock pulse as the least significant bit of the rate counter cycles between ONE and ZERO. Therefore, a ONE in the most significant bit of the counter 30 will generate an output pulse on every other clock pulse. On the other hand, these conditions will only be met once during the entire cycle of the rate counter for the least significant bit on the counter 30. Therefore, a ONE on the least significant bit of the counter 30 will produce an output pulse only once for each 4,096 clock pulses. It can be seen then that ONEs in the bits of the counter 30 produce output pulses at a rate proportional to the significance of the bits.

The crystal controlled clock 169 generates a stable and 230.4 kHz square wave which is reduced to a 57.6 kHz clock signal by cascaded flip-flops 171 and 173. The clock signal is applied via lead 175 to the rate multiplier and the complement is applied to NANDs 175 and 177 which in turn gate the flip-flop 179 comprising NANDS 181 and 183. The operation of this portion of the circuit can best be understood by reference to the waveform diagrams of FIG. 4. In the example, a four-bit rate multiplier is considered to simplify the explanation. The letters identifying each waveform are shown in FIG. 3*b* to indicate the point where the associated signal appears. However, the waveforms B-E are not so shown since they are generated within the rate multiplier 167. For purposes of example, assume that the four-bit binary number stored in the register is the 1010. The waveform A represents the clock pulses applied to the rate multiplier 167 through lead 175. The waveform B represents the signals appearing at the output of the AND gate associated with the most significant bit of the register. The wave-form E represents the signal appearing at the output of the AND gate associated with the least significant bit in the register. The waveforms C and D are similarly associated with the second and third most significant bits of the register, respectively.

On alternate pulses of the clock, the first bit of the rate counter in the rate multiplier will go to ONE and remain equal to ONE until the next clock pulse. However, in order to allow time for the clock pulse to propogate through the rate counter, the AND gates are enabled by the complement of the clock pulse so that, as shown in waveform D, an output pulse can only be generated if the most significant bit of the register is equal to ONE during the interval that the clock pulse is ZERO. In other words, the output pulses are delayed half a pulse. In any event, as the four-bit counter counts through in 16 pulses, eight output pulses will be generated by a ONE in the most significant bit of the register. Since it was assumed that the second most significant bit in the register was equal to ZERO, no output pulses would be generated by this bit. However, as indicated by the shaded pulses in waveform C, the AND gate associated with this bit is enabled by the alternate clock pulses which do not gate the most signficant bit. Again, enabling of the gate is delayed one-half pulse by the complement of the clock pulses. As indicated, four output pulses could be generated by a ONE in the second most significant bit of the register for each counting cycle of the rate counter. As shown by waveform D, the second least significant bit in the register can produce an output pulse only on alternate clock pulses which do not gate either of the higher order bits. Thus, only two pulses may be generated by this bit during each cycle of the rate counter. According to the pattern which should be clear at this point, the AND gate associated with the least significant bit of the register is gated only once for each 16 clock pulses. Again, since this bit was assumed to be equal to ZERO in the example, the pulse and waveform E is shaded.

The outputs of each of the AND gates associated with waveforms B-E are applied to an OR gate which produces the output waveform F of the rate multiplier. The missing pulses represent the ZEROs in the register. It can be appreciated that if all of the bits of the binary number had been ONE, the waveform F would have been a square wave interrupted by only one missing pulse which occurs when all of the bits in the rate counter are ZEROs.

The waveform F is gated with the waveform G, which is the complement of the clock pulses applied to the rate multiplier, in NAND 175 to generate the waveform H. The waveform H is equal to ONE except during those complementary clock pulse intervals when the waveform F is equal to ONE. Reference to FIG. 4 will shown that the waveform H is the complement of the waveform F. The waveform H serves as the output of the digital-to-pulse converter through lead 33. It also serves as the set input for flip-flop 179 and is gated with the complementary clock waveform G in NAND gate 177. NAND 177 generates the waveform J which serves as the reset input for the flip-flop 179. The waveform J is equal to ONE except during those complementary clock intervals when no pulse appears in the waveform F. The output of the flip-flop 179 is represented by the waveform K and is determined by the waveforms H and J. When waveform H goes to ZERO, K goes to ONE and remains equal to ONE until J goes to ZERO to reset K equal to ZERO. The effect of flip-flop 179 with its set and reset gates is to stretch the pulses in the waveform F to the full clock interval. This can be appreciated by noting in FIG. 4 that the waveform K follows the outline of the waveform F without the pulse down-times. The purpose of this is to convert the waveform F from a frequency signal to a pulse signal.

The outputs of the flip-flop 179 serve as a double-ended input for the pulse-to-analog converter 35. The pulse-to-analog converter includes a precision switch indicated generally by the reference character 187 for standardizing the amplitude and shape of the pulses generated by the flip-flop 179 and a filter, designated generally by the reference character 189, for extracting the DC component of the pulse train. A level shifting network 191 converts the complementary output signals of the flip-flop 179 from 0 to 5 volt signals referenced to ground to −5 to 0 volt signals referenced to analog ground for driving the precision switch. A suitable level shifting network is the Type 9622 Line Receiver mentioned above.

The upper and lower outputs of the flip-flop 179 are applied by the level shifting network 191 to the base electrodes of the npn transistors 193 and 195, respectively. The emitters of these two transistors are connected to a negative supply voltage and their collectors are connected through resistors 197 and 199, respectively, to a positive supply voltage. The collector of transistor 193 is also connected through the parallel combination of capacitor 201 and diode 203 to the gate electrode of the field effect transistor 205. Similarly, the collector of the transistor 195 is connected to the gate electrode of fet 207 through the parallel combination of capacitor 209 and diode 211. The fets 205 and 207 are connected in series between a +10 volt reference and ground. An output for the precision switch is provided by a potentiometer 213 connected between the source electrode of fet 205 and the drain electrode of fet 207. The output pulses are applied by the potentiometer to the low pass filter 189 comprising resistor 215 and capacitor 217 connected to ground. The voltage across the capacitor is applied to the non-inverting input of the operational amplifier 219 through resistor 221. The output of amplifier 219 is fed back to its inverting input by resistor 223 to form a unity gain high input impedance buffer. Diode 225 protects amplifier 219 from damage for overvoltage applied to its input.

The transistors 193 and 195 serve as drivers for the fets 205 and 207, respectively. They are alternately driven hard into saturation and cutoff in opposition to each other by the outputs of flip-flop 179. When 193 is off, fet 205 is switched on by the positive supply voltage applied to its gate electrode and an output pulse is developed. At the same time, transistor 195 is switched on to apply a negative voltage to the gate electrode of fet 207 to clamp it in the off state. When the outputs of flip-flop 179 change state, the transistor 193 is switched on to cut off fet 205 and transistor 195 is switched off to turn on fet 207. With fet 207 on, the slider of potentiometer 213 is effectively at ground potential. Thus, the precision switch generates output pulses of precise positive amplitude having the same time relations as the outputs of flip-flop 179.

The pulses generated by the precision switch are converted by the low pass filter 189 to a DC signal having an amplitude proportional to the ratio of the ON time to the OFF time of the applied pulses and therefore the accumulated count in counter 30. The parallel capacitor-diode combinations in the gate circuits of the fets permit only enough positive current to flow into the gate electrodes to positively switch the fets on, but permit negative current to be drawn from the gate electrodes to drive the fets hard into cutoff. The operational amplifier 219 prevents current drain on capacitor 217 to preserve the accuracy of the pulse-to-analog conversion. As discussed heretofore, the feedback signal appearing at the output of the operation amplifier 219 is applied to the error signal generator 19 shown in FIG. 3*a*. It is also applied to the low pulse cutoff circuit 45 which will be described hereinafter.

The digital-to-pulse converter output signal appearing on lead 33 and represented by the wave form H in FIG. 4 is applied to the frequency divider 39. Reference should be made to the copending application of James Carlton, reference (2) above, for a detailed description of the operation of the frequency divider which may also be referred to as a count divider. Essentially, the frequency divider is a free-running binary counter with output taps connected to selected bits of the counter. As the frequency divider counts the input pulses, the least significant bit of the counter will go to ONE on every other applied pulse to produce an output pulse train having half the frequency of the applied pulses. The next bit of the counter will go to ONE every other time the first bit goes to ONE and will therefore produce a pulse train having a frequency equal to one-half the frequency of that generated by the first bit or one-quarter that of the applied signal. In a similar manner, each successive bit of the frequency divider counter divides the pulse train of the preceding bit by one-half. Expressed differently, a particular bit of the frequency divider divides the frequency of the applied signal by a factor of two raised to a power equal to the order of the bit. Thus, the first bit divides the applied signal by $2^1 = 2$, the second divides it by $2^2 = 4$, and so on.

The frequency divider 39 comprises a binary counter having 22 bits. Actually, the counter is made up of six cascaded four-bit integrated circuit packages 39*a–e* with only two bits of the last counter utilized. Leads connected to bits 13 through 22 of the counter 39 are connected to the taps on ten-position selector switch 227. A wiper arm 229 can be positioned to apply any one of the signals appearing in bits 13 through 22 of the frequency divider to lead 231. Thus, the frequency divider provides division of the pulse train appearing on lead 33, in steps of two, from $2^{13}$ (8,192) to $2^{22}$ (4,194,304). Additional steps of division may be provided by adding bits to the frequency divider.

Figure 3A:
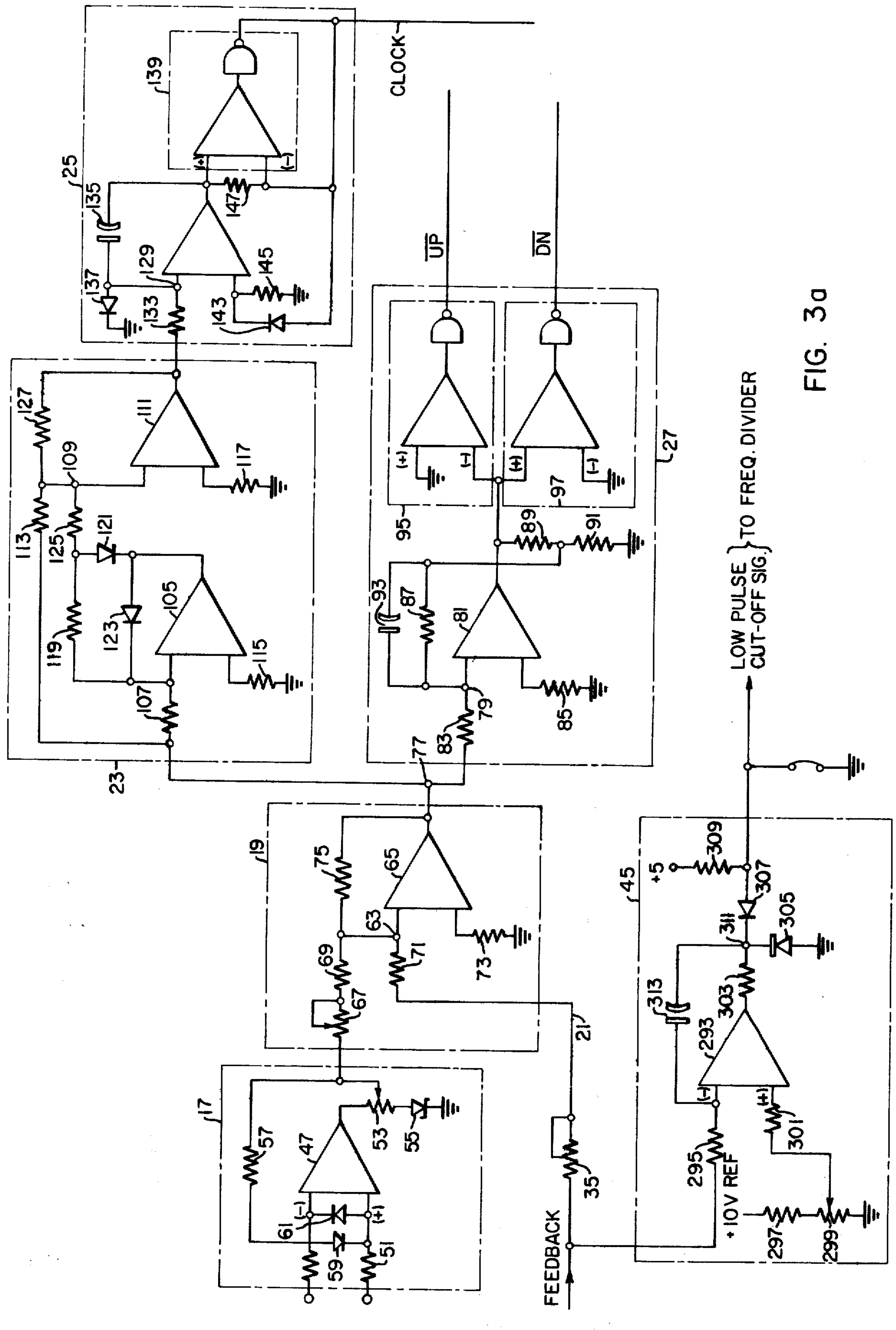
FIG. 3*a* is a schematic circuit diagram of those components in the block diagram of FIG. 2 lying to the left of the broken line.
Figure 3B:
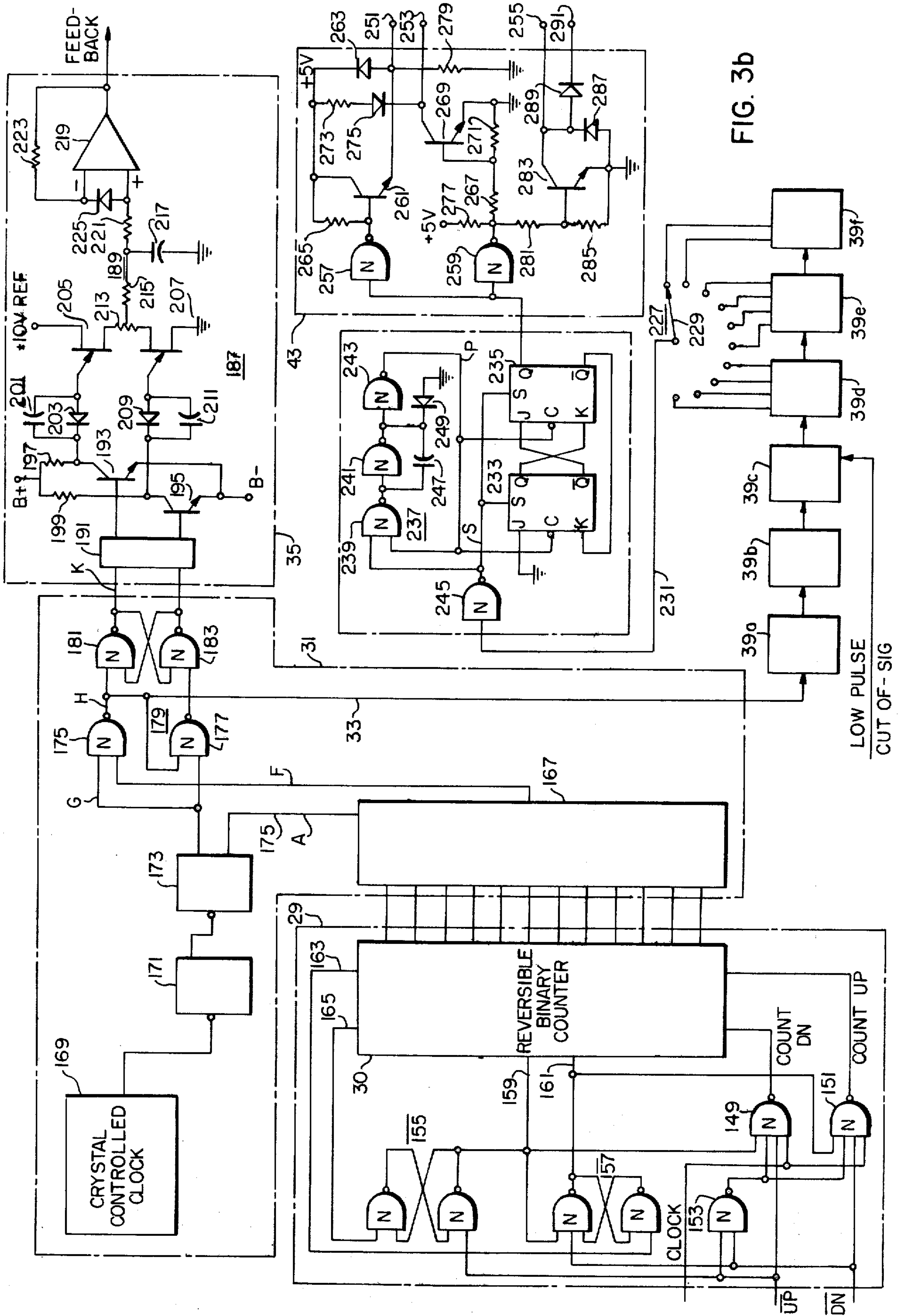
FIG. 3*b* is a schematic circuit diagram of the remaining components of the block diagram of FIG. 2 with indications of the interconnections with FIG. 3*a*.

Continuous selection of conversion factors between the established limits is provided for by the feedback potentiometer 35 shown in FIGS. 2 and 3*a*. Referring to FIG. 3*a*, with the combined value of the resistor 69 and the potentiometer 67 equal to the combined value of resistor 71 and the maximum value of potentiometer 35, the gain applied to the feedback signal relative to the input signal is ONE. If the maximum allowable input signal is now applied to the input buffer, the counter 30 will fill up by the time the feedback signal will equal the applied signal to stop the counting. On the other hand, if the effective resistance of feedback potentiometer 35 is reduced so that the combined resistance in the feedback loop is equal to one-half the combined value of resistor 69 and potentiometer 67, the gain in the feedback loop will be 2. Under these circumstances, the counter 29 would only be required to be half full before the effective feedback signal would equal the applied signal to stop the counting. With the accumulated count in counter 29 equal to one-half the maximum count, the digital-to-pulse converter will produce a pulse train having a frequency equal to one-half the maximum frequency of the digital-to-pulse converter. By adjusting the gain of the feedback loop relative to the input signal between 1 and 2 with potentiometer 35, the output frequency can be continuously varied by a factor of 2. Thus, by adjusting the frequency divider to the closest step below the desired output rate and then increasing the effective resistance of potentiometer 35, the pulse train may be divided by any desired factor between $2^{13}$ and $2^{23}$.

From the previous discussion, it is understood that an output pulse will be generated by the digital-to-pulse converter for 4095 clock pulses out of 4096 when the counter 30 is full. Since the frequency of the clock pulses applied to the rate multiplier in the digital-to-pulse converter is 57.6 kHz and since the maximum signal outputted by the buffer stage is 10.5 volts, it can be appreciated that a 10-volt applied signal will generate a pulse signal having a frequency of 27.307 to 54.613 kHz depending on the setting of the potentiometer 35. Therefore, the span of the output frequency of the frequency divider for a 10-volt applied voltage is continuously variable between 0.39063 and 400 pulses per minute. It is obvious from this that the conversion factor of the voltage-to-pulse converter may be varied by a factor of 1,000. This range is easily extended by tapping more bits of the frequency divider.

The signals generated by the frequency divider are square wave signals. Thus, for the twenty-second bit of the divider, the output signal will be equal to ONE for $2^{11}$ applied pulses and equal to ZERO for the next $2^{11}$ pulses. Such a signal is not suitable for driving a mechanical counter; therefore, the one-shot multivibrator 41 is provided. The multivibrator 41 includes two JK flip-flops 233 and 235 and a pulse generator identified generally by the reference character 237. The pulse generator includes NAND elements 239, 241 and 243 serially connected in a loop. The pulse generator is controlled by the output of NAND element 245 which is connected to the lead 231 from the frequency divider. When the output of the NAND element 245 is ZERO, the output of NAND element 239 will be equal to ONE which will cause the output of NAND element 243 to also be equal to ONE and the pulse generator will be at rest. When the output of NAND element 245 goes to ONE the pulse generator is released and the output of NAND element 239 will go to ZERO. This will cause the NAND elements in the pulse generator to successively and continually change states as long as the output of the NAND element 245 remains equal to ONE. The capacitor 247 across the NAND element 241 is provided to control the frequency of the oscillations. The diode 249 is connected between the output of NAND element 241 and ground to prevent the input to NAND element 243 from going too far negative due to the charge on capacitor 247 when the input to NAND element 241 goes from ONE to ZERO.

The output of NAND 243 which serves as the output of the pulse generator is applied to the gate electrodes of the JK flip-flops 233 and 235. The output of NAND element 245 is applied to the set direct inputs S of the flip-flops. The Q and $\overline{Q}$ outputs of the flip-flop 233 are connected to the K and J inputs respectively, of flip-flop 235. The $\overline{Q}$ output of flip-flop 235 is connected to the K input of the flip-flop 233. The J input of flip-flop 233 is connected to ground. The Q output of flip-flop 235 serves as the output of the multivibrator.

The operation of the multivibrator 41 can best be understood by reference to the waveform diagrams of FIG. 5 and the truth table for the JK flip-flop shown in FIG. 6. The JK flip-flop is a well-known logic device having complementary outputs Q and $\overline{Q}$. The state of the output signals depends upon the signals applied to the J and K inputs. However, the JK flip-flop may only change states when a signal is applied to the gate input. The truth table of FIG. 6 sets forth the possible combinations of signals that can applied applies to the J and K inputs. The combination of inputs applied to the flip-flop at the time $T_n$ when the gate signal is applied determines the condition the Q output will assume at the time $T_n + 1$. As indicated, if ZEROs are applied to the J and K inputs, the Q output will remain the same. On the other hand, if ONEs are applied to both inputs during the gating pulse, the Q output will change states regardless of its original state.

Referring now to FIGS. *3b* and 5, the S waveform represents the output of the NAND 245 and is the complement of the output of the frequency divider which appears on lead 231. When the output of frequency divider goes to ONE, S will go to ZERO. With this ZERO signal applied to the set-direct inputs of flip-flops 233 and 235 the Q outputs will be forced to ONE. The states of the inputs to the flip-flop at this point can be determined from FIG. 6. At the trailing edge of the pulse from the frequency divider, the signal S will go from ZERO to ONE, thus, releasing the pulse generator 237. As mentioned above, the output waveform P of the pulse generator will be equal to ONE until it is released. One pulse interval after the signal S goes to ONE, pulses will begin to appear as shown by waveform P. The high to low transition of the pulses P serve as the gating signal to the flip-flops 233 and 235. At the time of the first gating pulse the J and the K inputs of flip-flop 233 are both equal to ZERO and, as seen in the truth table, the output signal Q will remain equal to ONE. However, during this first gating interval, the J input to the flip-flop 235 is equal to ZERO while the K input is equal to ONE. This will cause the Q output of flip-flop 235 to go from ONE to ZERO. At the same time, the $\overline{Q}$ output of flip-flop 235 will cause the K input to the flip-flop 233 to go to ONE. Therefore, on the next gating pulse the Q output of the flip-flop 233 will go to ZERO. However, the gating pulse will also be applied to the flip-flop 235 before the output of the flip-flop 233 changes state. Since, at that instance, the J input to flip-flop 235 still equals ZERO and the K input still equals ONE, the output Q will remain equal to ZERO. By the time of the next gating pulse, however, the output of flip-flop 233 will have changed state so that the Q output of the flip-flop 235 will go to ONE.

On subsequent gating pulses, the J and K inputs to flip-flfop 233 will remain equal to ZERO so that the Q output cannot change state. This means that the J and K inputs to flip-flop 235 will not change either so that the Q output of this flip-flop remains equal to ONE. Although the pulse generator will continue to generate pulses for the duration of the output pulse of the frequency divider, the flip-flops will not change state. At the conclusion of the pulse generated by the frequency divider, the signal S will return to ZERO to cut off the pulse generator and force the Q outputs of flip-flops 233 and 235 to ONE in preparation for the next pulse from the frequency divider. Thus, each pulse from the frequency divider generates an output pulse having a pulse width of approximately 60 milliseconds, regardless of the pulse duration of the applied signal.

The 60 millisecond pulse from the Q output of flip-flop 235 is applied to the output driver 43 which has three output terminals. Terminals 251 and 253 provide a logic output and the terminal 235 is a current sinking output. The signal from the multivibrator which is normally equal to ONE but goes to ZERO for an output pulse is inverted by NANDs 257 and 259. The output of NAND 257 is connected to the base of npn transistor 261. The collector of this transistor is connected to a +5 volt supply and the emitter is connected to the logic output 251. A diode 263 is connected across the emitter and collector of transistor 261 to protect it. A resistor 265 is connected between the +5 volt supply and the output of NAND 257 to assist it in supplying drive current to transistor 261. The output of NAND element 259 is connected through resistor 267 to the base of npn transistor 269. Resistor 271 is connected between the base of this transistor and ground. The collector of transistor 269 is connected to the +5 volt supply through resistor 273 and diode 275 while the emitter is connected to ground. The collector is also connected to the logic output 253. The +5 volt supply aids NAND element 259 to provide current through resistor 277. Between pulses from the multivibrator, the outputs of NAND elements 257 and 259 will be ZERO so that transistors 261 and 269 are cut off. Under these conditions, ZERO volts will appear at terminal 251 and the +5 volts will appear at terminal 253 through the resistor 273 and diode 275. When the multivibrator generates a pulse and the outputs of NAND elements 257 and 259 go to ONE, both transistor 261 and 269 will be turned on. With transistor 269 conducting the terminal 253 will be at virtual ground. On the other hand, with transistor 261 conducting approximately +5 volts will appear across the resistor 279 and at the terminal 251. Thus, complementary logic signals appear at terminals 251 and 253 with the signal at 251 being the positive signal.

The output of NAND 259 is also connected through resistor 281 to the base of npn transistor 283. A bias resistor 285 is connected between the base and emitter of transistor 283 and the emitter is connected to ground. The collector of transistor 283 is connected to the current sinking terminal 255. A diode 287 is connected across the emitter and collector of the transistor. The terminal 255 may be connected to one terminal of the coil of a mechanical counter, the other terminal of which is connected to a positive voltage source. When no pulse is being generated by the multivibrator so that the output of NAND 259 is ZERO, the transistor 283 is cut off and no current can flow through the coil of the counter. However, when the output of NAND 259 goes to ONE in response to a pulse from the multivibrator, transistor 283 is turned on, thereby completing a current path for the coil of the counter. It is desirable that a diode 289 be connected between the terminal 255 and the terminal 291 which is connected to the other side of the counter coil to prevent the induced current caused by the collapsing field of the counter-coil from damaging transistor 283.

As noted previously, the stability of the disclosed voltage-to-pulse converter renders a low-pulse cut-off circuit unnecessary. However, if desired, such a circuit may be provided as shown in FIG. 3*a.* The feedback signal is applied to one input of comparator 293 through resistor 295. The feedback signal is compared with a bias signal derived from a voltage divider including resistor 297 and potentiometer 299 connected between a 10-volt reference source and ground. This bias signal is applied through resistor 301 to the other input of comparator 293. The output of the comparator 293 is connected through resistor 303 and diode 305 to ground. A blocking diode 307 is connected between the resistor 303 and the output to the frequency divider. A resistor 309 is connected between +5 volt supply and the output terminal. Under normal conditions when the feedback signal exceeds the bias signal the output of the comparator 293 will be negative. However, the diode 305 permits the junction 311 to only go to approximately 0.6 volts negative. The diode 307 matches the forward drop of diode 305 so that the output signal of the circuit remains equal to ZERO. When no signal is being applied to the voltage-to-pulse converter so that the feedback signal is less than the bias signal, the junction 311 will go positive. The diode 307 will then permit the output of the frequency divider to rise no higher than +5 volts. Referring to FIG. 3*b*, it will be seen that the low pulse cut-off signal is applied to the counter 39*c* to lock up counters 39*a–c* at all ONEs and prevent a carry-over into the remainder of the frequency divider. The capacitor 313 prevents oscillation of the circuit when a feedback signal and bias signal are approximately equal. The low-pulse cut-off signal may be shunted to ground with jumper JC if it is not required. The low-pulse cut-off circuit allows the output to be suppressed until a threshold, adjustable from ZERO to 25 percent of the input span through potentiometer 299, is reached.

The subject voltage-to-pulse converter is readily adaptable to printed circuit implementation. The reversible digital counter, the rate multiplier, and the frequency divider are all available in integrated circuit packages which greatly reduces the over-all size of the device. The entire network has been mounted on a single printed circuit card approximately six inches by twelve inches for edge mounting in printed circuit racks with thumb wheel switches for the coarse and fine adjustments easily accessible at the front edge of the card.

I claim at my invention:

1. A voltage to pulse converter comprising:

an error signal generator for generating an error signal as a function of the difference between an applied signal and a feedback signal, a clock for generating pulses in response to the presence of an error signal, a counter for accumulating a count of the clock pulses, a digital-to-pulse converter for generating output pulses at a rate proportional to the accumulated count in the counter, and a pulse-to-analog converter for generating the feedback signal as a function of the output pulses.

2. The apparatus of claim 1 wherein the counter is a reversible counter operative to count the clock pulses in one direction when the applied signal exceeds the feedback signal and to count the clock pulses in the opposite direction when the feedback signal exceeds the applied signal cm 3. The apparatus of claim 2 wherein said clock is a voltage clock operative to generate clock pulses at a rate proportional to the magnitude of the error signal.

3. The apparatus of claim 2 wherein said clock is a voltage clock operative to generate clock pulses at a rate proportional to the magnitude of the error signal.

4. The apparatus of claim 3 including frequency reducing means operative to divide down the output pulses generated by the digital-to-pulse converter.

5. The apparatus of claim 4 wherein the frequency reducing means includes a frequency divider for selectively dividing down the output pulses generated by the digital-to-pulse converter by multiples of 2.

6. The apparatus of claim 2 including scaling means for providing a continuous selection of the ratio of the frequency of the pulses generated by the digital-to-pulse converter to the magnitude of the applied signal over an extended range.

7. The apparatus of claim 6 wherein the scaling means includes:

a frequency divider for selectively counting down the pulses generated by digital-to-pulse converter by factors of 2, and means for applying variable gain to the feedback signal, said gain being continuously variable over a range sufficient to permit the ratio of the frequency of the pulses generated by the digital-to-pulse converter to the magnitude of the applied signal to be varied continuously by a factor between 1 and 2.

8. The apparatus of claim 1 wherein the digital-to-pulse converter comprises a fixed frequency clock and a rate multiplier driven by the fixed frequency clock, said rate multiplier being connected to the counter and operative to generate output pulses by gating pulses from the fixed frequency clock in proportion to the accumulated count in said counter.

9. The apparatus of claim 8 wherein the pulse-to-analog converter includes means for generating shaped pulses from the output pulses generated by the digital-to-pulse converter, said shaped pulses having a precise amplitude and a precise duration determined by the fixed frequency of the fixed frequency clock, and means for generating the feedback signal as a function of the time average of the shaped pulses.

10. The apparatus of claim 9 including frequency reducing means for dividing down the output pulses generated by the digital-to-pulse converter.

11. Apparatus for monitoring the boric acid concentration in the coolant of a nuclear reactor, said combination including:

means for generating a voltage signal proportional in magnitude to the flow of boric acid added to the coolant, an error signal generator for generating an error signal as a function of the difference between said voltage signal and a feedback signal, a clock for generating pulses in response to the presence of an error signal, a counter for accumulating a count of the clock pulses, a digital-to-pulse converter for generating output pulses at a rate proportional to the accumulated count in the counter, a pulse-to-analog converter for generating the feedback signal as a function of the output pulses, and an additional counter for accumulating a count of output pulses generated by the digital-to-pulse converter.

12. The apparatus of claim 11 wherein said voltage-to-pulse converter is a high-frequency converter and wherein said additional counter is a mechanical counter, said combination including frequency reducing means for generating pulses at a rate proportional to, but substantially less than, that of the voltage-to-pulse converter and means for applying the pulses generated by the frequency reducing means to the mechanical counter.

13. The apparatus of claim 12 wherein said clock in the voltage-to-pulse converter is a voltage clock operative to generate pulses at a frequency proportional to the magnitude of the error signal.

14. The apparatus of claim 13 including means for varying the conversion ratio of the frequency of the pulses applied to the mechanical counter to the magnitude of the voltage signal applied to the voltage-to-pulse converter.

15. The apparatus of claim 14 wherein the means for varying the conversion ratio is provided for in the frequency reducing means which comprises a frequency divider having means for selectively dividing down the pulses generated by the digital-to-pulse converter by a factor of 2 in steps over an extended range, and a one-shot multi-vibrator responsive to pulses generated by the frequency divider for generating pulses suitable for driving a mechanical counter.

16. The apparatus of claim 15 wherein the means for adjusting the conversion ratio includes means for continuously varying the ratio of pulses accumulated in the reversible counter to the applied voltage over a range of 2 to 1.

17. A method for monitoring the boric acid concentration in the coolant of a nuclear reactor, comprising the steps of:

generating a voltage signal proportional to the flow of boric acid added to the coolant, generating an error signal as the difference between the voltage signal and a feedback signal, converting the error signal to a pulse signal, accumulating a count of the pulses generated in response to the error signal, converting the accumulated count to an output pulse signal having a pulse rate proportional to the accumulated count, generating the feedback signal as a function of the output pulse signal, generating divided down output pulses by dividing down the pulses in the output pulse signal, and applying the divided down output pulses generated to a mechanical counter.

18. A method of converting an applied voltage signal to a pulse signal comprising the steps of:

generating an error signal as the difference between the applied signal and a feedback signal, converting the error signal to a pulse signal, accumulating a count of the pulses generated in response to the error signal, converting the accumulated count to an output pulse signal having a pulse rate proportional to the accumulated count, and generating the feedback signal as a function of the output pulse signal.

19. The method of claim 18 wherein the error signal is converted to a pulse signal having a frequency proportional to the magnitude of the error signal.

20. The method of claim 18 including the step of dividing down the output pulses.

* * * * *